United States Patent [19]

Ibuchi

[11] Patent Number: 5,017,959
[45] Date of Patent: May 21, 1991

[54] IMAGE FORMING APPARATUS AND MEDIA CARTRIDGE FOR USE IN THE SAME

[75] Inventor: Yoshiaki Ibuchi, Nara, Japan

[73] Assignee: Sharp Kabushiki Kaisha, Osaka, Japan

[21] Appl. No.: 555,730

[22] Filed: Jul. 23, 1990

[30] Foreign Application Priority Data

Jul. 31, 1989 [JP] Japan ................................ 1-199728
Aug. 31, 1989 [JP] Japan ................................ 1-226416

[51] Int. Cl.$^5$ .......................................... G03B 27/52
[52] U.S. Cl. ..................................... 355/27; 355/100; 355/72; 355/133
[58] Field of Search ................. 355/27, 100, 106, 72, 355/309, 321, 133; 354/85-87

[56] References Cited

U.S. PATENT DOCUMENTS 4,864,352  9/1989  Morita .................................. 355/27
4,918,482  4/1990  Ogura .................................. 355/27

FOREIGN PATENT DOCUMENTS 63-266444  11/1988  Japan .

OTHER PUBLICATIONS

Patent Abstracts of Japan, "Photosensitive Member in Photosensitive Transfer Type Image Forming Device," 63-266444(A), laid open Nov. 2, 1988.

Primary Examiner—L. T. Hix
Assistant Examiner—D. Rutledge
Attorney, Agent, or Firm—Nixon & Vanderhye

[57] ABSTRACT

An image forming apparatus has a main body and an optical device provided in the main body for producing an exposure light of an image signal. The image forming apparatus also has a media cartridge detachably mounted to the main body. The media cartridge includes a supplying shaft on which unused photosensitive and pressure sensitive sheet is rolled for continuously supplying the unused sheet, an exposure section where the supplied unused sheet is exposed by the exposure light for forming a latent image on the supplied unused sheet, a pressure developing section to which an image receiver sheet is supplied and at which the receiver sheet is superposed and pressed onto the exposed sheet for pressure-developing an image onto the receiver sheet from the latent image, and a winding-up shaft for winding up the used sensitive sheet.

15 Claims, 4 Drawing Sheets

IMAGE FORMING APPARATUS AND MEDIA CARTRIDGE FOR USE IN THE SAME

BACKGROUND OF THE INVENTION

1. Field of the Invention apparatus using a photosensitive and pressure sensitive sheet.

The present invention also relates to a media cartridge, which contains such a photosensitive and pressure sensitive sheet, for use in such an image forming apparatus.

2. Description of the Related Art

As one of various kinds of image forming apparatuses, there is an image forming apparatus using a photosensitive and pressure sensitive sheet.

Such a sensitive sheet is made of a resin film coated with microcapsules. The microcapsules contain photohardening resin and coloring material in its shell. The photohardening resin is polymerized by light. This sensitive sheet makes a pair with an image receiver sheet, for performing its color development.

That is to say, the receiver sheet is coated with developing material which develops the coloring material in the microcapsules when the microcapsules are ruptured and the coloring material is flown out therefrom.

The microcapsules are hardened by the polymerization of the resin caused by the illumination of the exposure light for forming a latent image such as a light reflected from the original onto the sensitive sheet. Thus, a latent image is formed on the sensitive sheet. Then, by superposing the receiver sheet onto the sensitive sheet and applying a pressure force thereon, the microcapsules which are not hardened are ruptured, thus an image is formed on the receiver sheet by the development of the coloring material of the ruptured microcapsules in cooperation with the developing material of the receiver sheet.

In the image forming apparatus using such a photosensitive and pressure sensitive sheet, the unused sensitive sheet should be guarded from light and pressure so a to maintain its photosensitive property and pressure sensitive property.

Accordingly, a media cartridge is used in this kind of image forming apparatus for accommodating the unused sensitive sheet in a rolled form so as to guard the sensitive sheet from external light and pressure. The media cartridge is provided with a supplying shaft on which the unused sensitive sheet is rolled to supply the sensitive sheet therefrom. The media cartridge is also provided with a winding-up shaft to wind up the used sensitive sheet. The media cartridge is detachably mounted to a main body of the image forming apparatus so as to allow an exchange of the sensitive sheet by exchanging the media cartridge.

When the media cartridge is mounted to the main body, the tip portion of the sensitive sheet, which is pulled out from the supplying shaft of the media cartridge, is set through various kinds of rollers and a specific transport path, which are provided in the exposure section and the pressure developing section in the main body of the image forming apparatus, to the winding-up shaft of the media cartridge. Then, the image forming operation can be performed as the unused sensitive sheet is drawn out from the media cartridge and transported through the exposure section and the pressure developing section of the main body, and then the used sensitive sheet is returned to the media cartridge.

However, in this kind of image forming apparatus, once the media cartridge is set to the main body, it is difficult to exchange the sensitive sheet in its half used condition in the media cartridge. Particularly, it is necessary to cut once the sensitive sheet in order to remove the media cartridge out of the main body, since the sensitive sheet is wound between the supplying shaft and the winding-up shaft through the exposure section and the developing section provided in the main body. Further, if the sensitive sheet, which is in a half used condition, is to be set again to the main body, the tip portion of the sensitive sheet must be set again appropriately through the exposure section and the developing section in the main body, resulting in that a length of the sensitive sheet needed for such an initial setting process is wasted. In addition, such an initial setting process is troublesome and time consuming since it should be performed in a relatively narrow space in the main body.

The pressure force needed for the pressure developing process at the developing section is relatively large, so it is also difficult to achieve a condition to apply such a pressure force and a condition to release the applied pressure force.

SUMMARY OF THE INVENTION

It is therefore a first object of the present invention to provide an image forming apparatus, in which an exchange operation of the photosensitive and pressure sensitive sheet can be easily performed.

It is a second object of the present invention to provide a media cartridge, which contains the photosensitive and pressure sensitive sheet and enables an easy exchange operation of the sensitive sheet for such an image forming apparatus.

According to the present invention, the first object can be achieved by an image forming apparatus having a main body and an optical device provided in the main body for producing an exposure light of an image signal. The image forming apparatus also has a media cartridge detachably mounted to the main body. The media cartridge includes a supplying shaft on which unused photosensitive and pressure sensitive sheet is rolled for continuously supplying the unused sheet, an exposure section where the supplied unused sheet is exposed by the exposure light for forming a latent image on the supplied unused sheet, a pressure developing section to which an image receiver sheet is supplied and at which the receiver sheet is superposed and pressed onto the exposed sheet for pressure-developing an image onto the receiver sheet from the latent image, and a winding-up shaft for winding up the used sensitive sheet.

In the image forming apparatus of the present invention, the media cartridge is detachably mounted to the main body. The media cartridge includes the supplying shaft, the exposure section, the pressure developing section and the winding up shaft. Accordingly, a transporting path of the sensitive sheet from the supplying shaft to the winding-up shaft is all provided within the media cartridge. Thus, it is not required to transport the sensitive sheet through the main body. Accordingly, there is no need to cut the sensitive sheet for removing the media cartridge from the main body, to release the pressure force applied in the pressure developing process for each media cartridge exchanging operation, or to set the tip portion of the sensitive sheet through a specific transport path in the main body for each initial setting operation. Consequently, the sensitive sheet can be easily exchanged by exchanging the media cartridge easily.

According to the present invention, the second object can be achieved by a media cartridge for use in an image forming apparatus which forms an image on an image receiver sheet by exposing and pressure-developing a photosensitive and pressure sensitive sheet and to which the media cartridge is detachably mounted. The media cartridge includes a supplying shaft on which unused photosensitive and pressure sensitive sheet is rolled for continuously supplying the unused sheet, and an exposure section, where the supplied unused sheet is exposed by an exposure light of image signal produced in the image forming apparatus, for forming a latent image on the supplied unused sheet. The media cartridge also includes a pressure developing section, to which the receiver sheet is supplied and at which the receiver sheet is superposed and pressed onto the exposed sheet, for pressure-developing an image onto the receiver sheet from the latent image. The media cartridge further includes a winding-up shaft for winding up the used sensitive sheet.

In the media cartridge of the present invention, a transporting path of the sensitive sheet from the supplying shaft to the winding up shaft is all provided within the media cartridge. Thus, it is not required to transport the sensitive sheet through the image forming apparatus.

Consequently, the media cartridge enables an easy exchange operation of the sensitive sheet for the image forming apparatus.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 1:
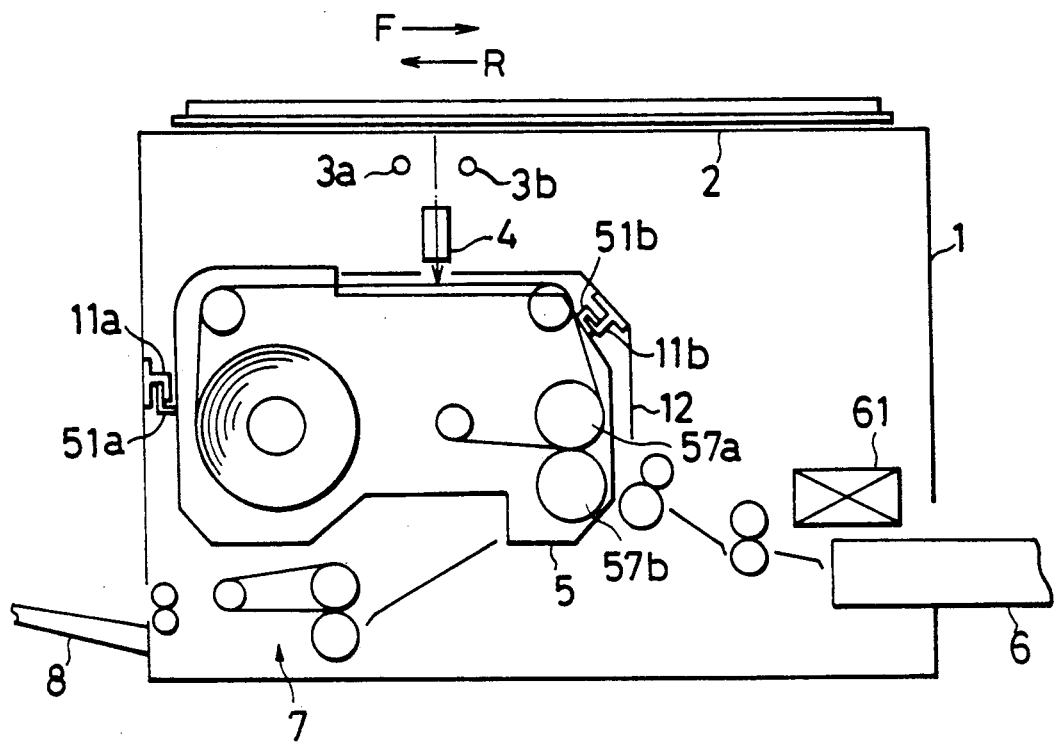
FIG. 1 is a schematic cross sectional view showing a first embodiment of the present invention.

FIG. 1 shows a copying apparatus of a first embodiment according to the present invention.

In FIG. 1, the copying apparatus of an original table moving type includes a main body 1. An original table 2 is provided on the upper face of the main body 1. The original table 2 is movable in a feed direction as designated by an arrow F and in a return direction as designated by an arrow R. On the original table 2, an original to be copied is placed.

Light sources 3a, 3b for illuminating the original and an optical body 4 for converging and transmitting light are disposed under the original table 2. The light sources 3a, 3b and the optical body 4 scan the original when the original table 2 moves in the F direction, and the reflected light is led to an exposure section of the copying apparatus as described later.

A media cartridge 5 is detachably mounted in a central portion of the main body 1. The media cartridge 5 can be mounted from the front face of the main body 1 in FIG. 1. The media cartridge 5 is shown in more detail in FIG. 2. FIG. 3 shows the media cartridge 5 when it is drawn out of the main body 1.

Figure 2:
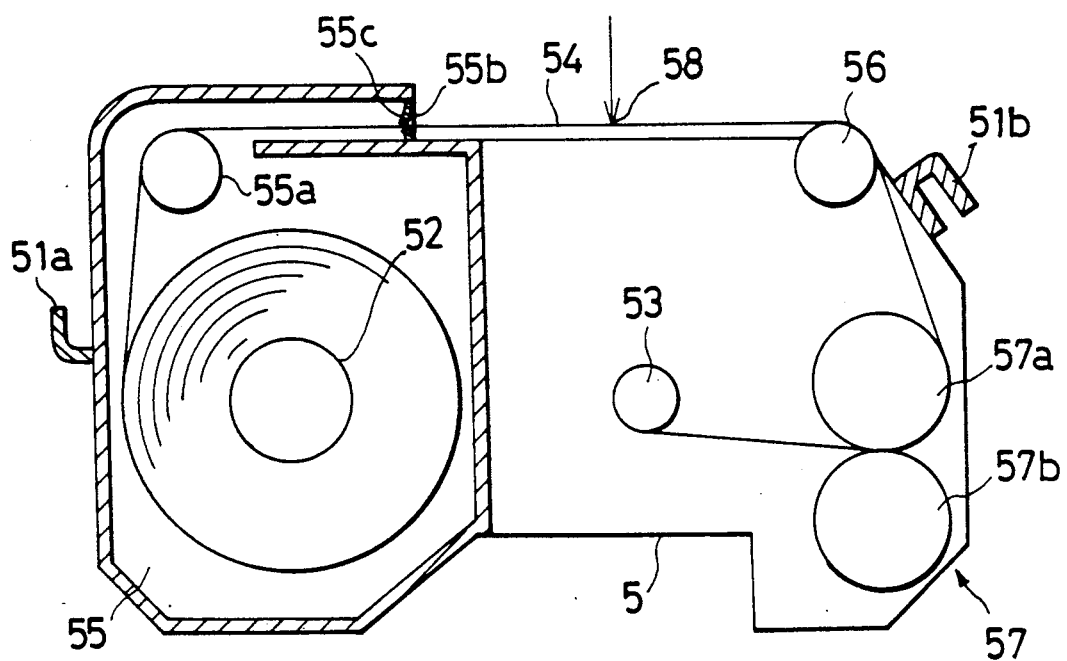
FIG. 2 is a schematic cross sectional view showing the media cartridge of the embodiment in FIG. 1.
Figure 3:
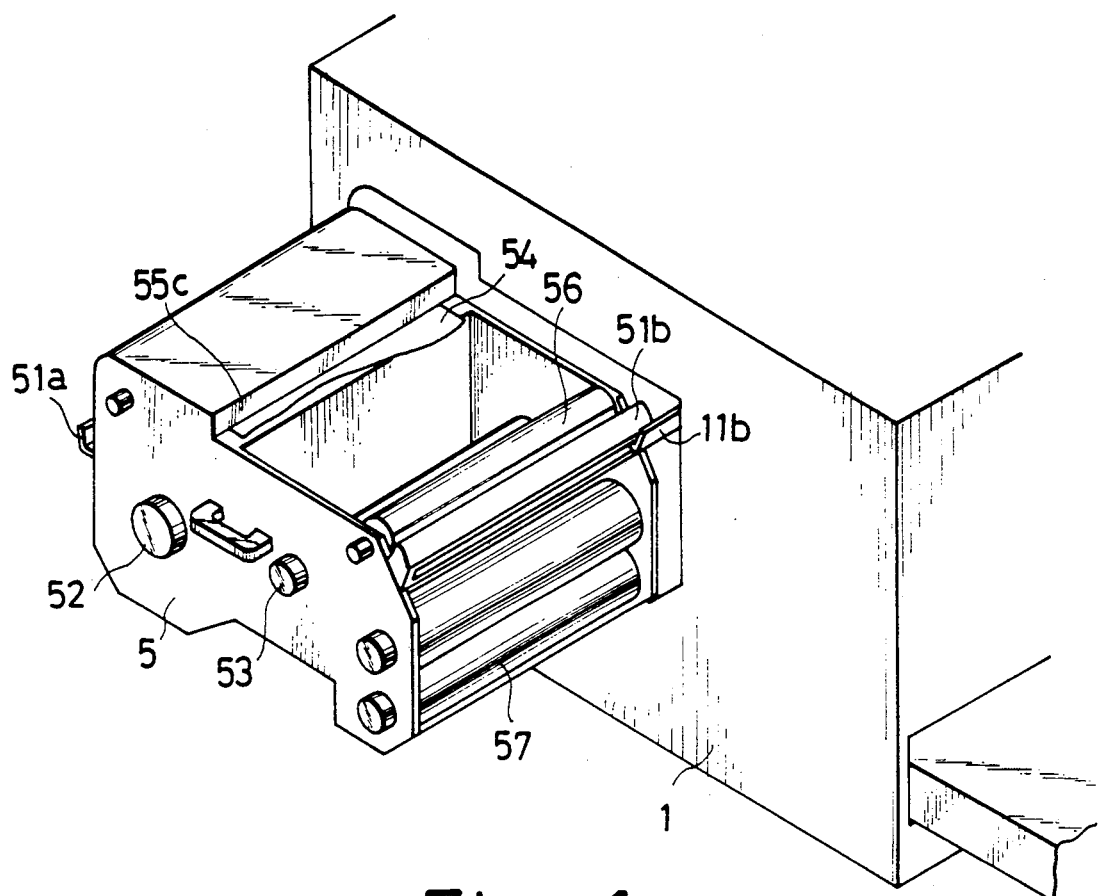
FIG. 3 is a perspective view showing the media cartridge in a drawn-out condition of the embodiment in FIG. 1.

As shown in FIGS. 1 to 3, the media cartridge 5 is provided on its both sides, with rails 51a, 51b extending in a direction perpendicular to a plane of FIG. 1. The main body 1 is provided with rails 11a, 11b which are engaged with the rails 51a, 51b so as to enable the dragging-out and inserting operations of the media cartridge 5.

As shown in FIG. 2, the media cartridge 5 includes a supplying shaft 52 and a winding-up shaft 53 which are rotatably supported in the media cartridge 5.

Unused photosensitive and pressure sensitive sheet 54 is rolled on the supplying shaft 52 and accommodated in an accommodation room 55 which shields the unused sheet 54 from external light. In the accommodation room 55, there is also provided a roller 55a which is disposed parallel to the supplying shaft 52. The roller 55a guides the sheet 54 from the supplying shaft 52 to the outside of the accommodation room 55 through an opening 55b which is formed on a wall of the accommodation room 55 at a vicinity of the roller 55a. The opening 55b is provided with a light shielding member 55c which is made of elastic material for cutting off the light from the external of the accommodation room 55 to the opening 55b.

A transporting roller 56, a pressure developing device 57 and the winding-up shaft 53 are disposed in the media cartridge 5 at the outside of the accommodation room 55.

The pressure developing device 57 includes an upper roller 57a and a lower roller 57b. The pressure developing device 57 is adapted to make the rollers 57a and 57b abut to and press each other by a pressure loading mechanism including a spring member not shown in the figures. The sheet 54 drawn out from the opening 55b is transported though the transporting roller 56 and between the roller 57a and the roller 57b, and then is wound up by the winding up shaft 53.

An exposure section 58 is provided between the opening 55b and the transporting roller 56. The reflected light from the original is led to the exposure section 58 by the optical body 4. A latent image is formed on the sheet 54 at the exposure section 58.

In FIG. 1, a light shielding guide 12 is disposed over the path of the sheet 54 outside of the accommodation room 55 in the media cartridge 5 in order to prevent the stray light from exposing the unused portion and the latent image formed portion of the sheet 54.

The supplying shaft 52 is radially loaded in a direction opposite to the drawing-out direction of the sheet 54. The winding-up shaft 53 is radially loaded in such a direction as to wind up the sheet 54. Accordingly, a tension is generated in the sheet 54 between the supplying shaft 52 and the winding up shaft 53 so as to prevent the sheet 54 from jamming therebetween.

A gear is provided on the end of the roller 57b at its behind side in FIG. 1, and is engaged with a driving gear provided in the main body 1 such that the rotational force is transmitted from the driving gear to the roller 57b. The roller 57a is adapted to follow the rotating movement of the roller 57b.

An image receiver sheet is accommodated in a sheet cassette 6 set at the right side of the main body 1 in FIG. 1. The receiver sheet is supplied from the sheet cassette 6 to the pressure developing device 57 by a sheet supplying device 61.

A heating device 7 is provided in the main body 1 for heating the receiver sheet which has passed the pressure developing device 57.

A sheet discharging tray 8 is provided at the left side of the main body 1 in FIG. 1 for keeping the receiver sheet on which a desirable image is formed and which is discharged from the main body 1 through the heating device 7.

An operation of thus constructed first embodiment is explained below.

Before the copying operation is started, the media cartridge 5 is inserted to the main body 1 while the sheet cassette 6 is filled with a plurality of the receiver sheets.

Then, the original to be copied is placed on the original table 2 and the copying operation starts.

When the sheet 54 is transported to the exposure section 58, the light sources 3a,3b illuminate the original. The sheet 54 is made of a resin film coated with microcapsules which grain size is about 5 to 6 μm. The microcapsules contain photohardening resin and coloring material in its shell. The microcapsules are hardened by the polymerization of the resin caused by the illumination of light. Accordingly, when the reflected light from the original is led to the exposure section 58 by the optical body 4, the latent image is formed on the sheet 54.

After the latent image is formed, the sheet 54 is transported to the pressure developing device 57, where the receiver sheet is superposed on the sheet 54 and the pressure force is applied by the rollers 57a, 57b. The receiver sheet is coated with developing material which develops the coloring material in the microcapsules when the microcapsules are ruptured. Thus, by this pressure applying operation, the microcapsules which are not hardened by the reflected light are ruptured, and an image of the coloring material is formed on the receiver sheet. The image formed receiver sheet is then transported to the heating device 7, where the coloring reaction is developed and, at the same time, a thermoplastic resin coated beforehand o the receiver sheet is unhardened to cover the receiver sheet and give luster to the formed image. Then, the receiver sheet is discharged onto the sheet discharging tray 8.

As described above, according to the copying apparatus of the first embodiment, the sheet 54 is transported from the supplying shaft 52 to the winding-up shaft 53 only through its path within the media cartridge 5. Accordingly, for a media cartridge exchanging operation, it is required only to draw out the media cartridge 5 along the rails 11a, 11b insert another media cartridge, without any difficulty or time consuming operation such as pulling and setting the tip portion of the sheet around rollers, etc. through the specific path in the main body as in the traditional way. It is also advantageous, in the first embodiment, that there does not occur a jam of the sheet 54 which tends to occur in such an initial setting process of the traditional way. For removing the media cartridge 5 from the main body 1, it is not required to release the pressure force applied between the roller 57a and the roller 57b, instead, the media cartridge 5 can be removed with the pressure force applied on since those rollers 57a, 57b are provided in the media cartridge 5. In case that the media cartridge 5 is exchanged in its half used condition, for example in order to change the color of the sheet 54, it is not required to cut the sheet 54, resulting in preventing a wasteful use of the sheet 54.

Consequently, the media cartridge 5 can be very easily exchanged without a waste of the sensitive sheet in the first embodiment.

Figure 4:
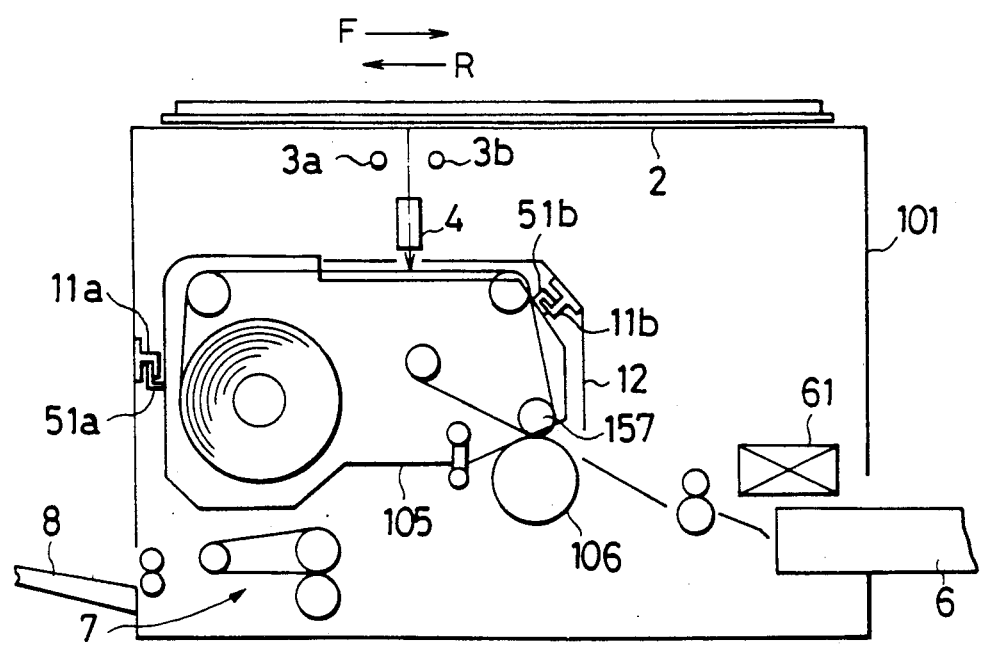
FIG. 4 is a schematic cross sectional view showing a second of the present invention.
Figure 5:
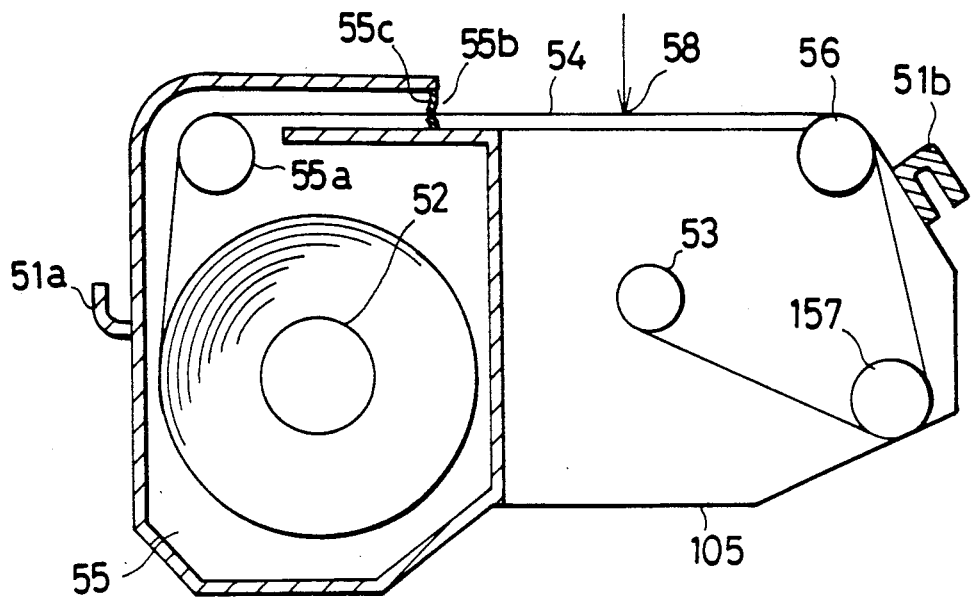
FIG. 5 is a schematic cross sectional view showing the media cartridge of the embodiment in FIG. 4.
Figure 6:
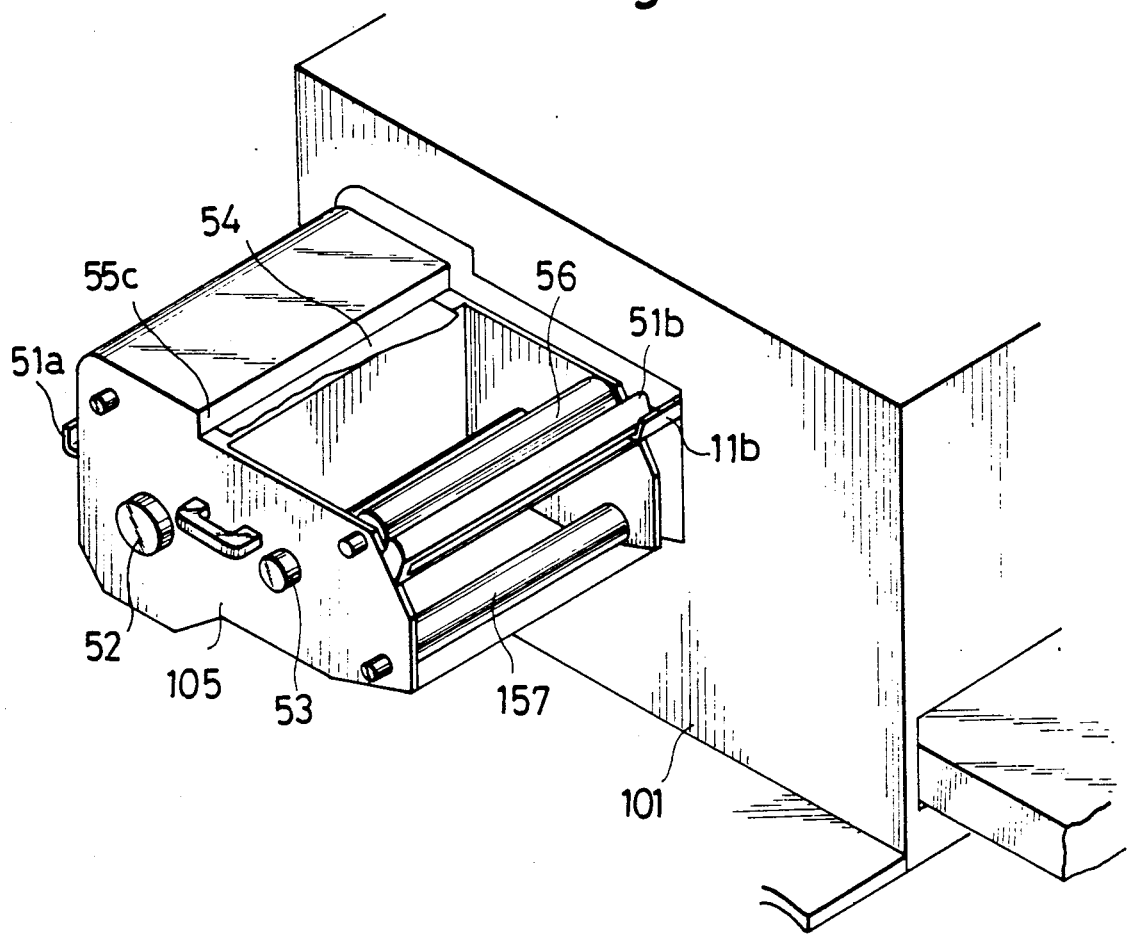
FIG. 6 is a perspective view showing the media cartridge in a drawn-out condition of the embodiment in FIG. 4.
Figure 7:
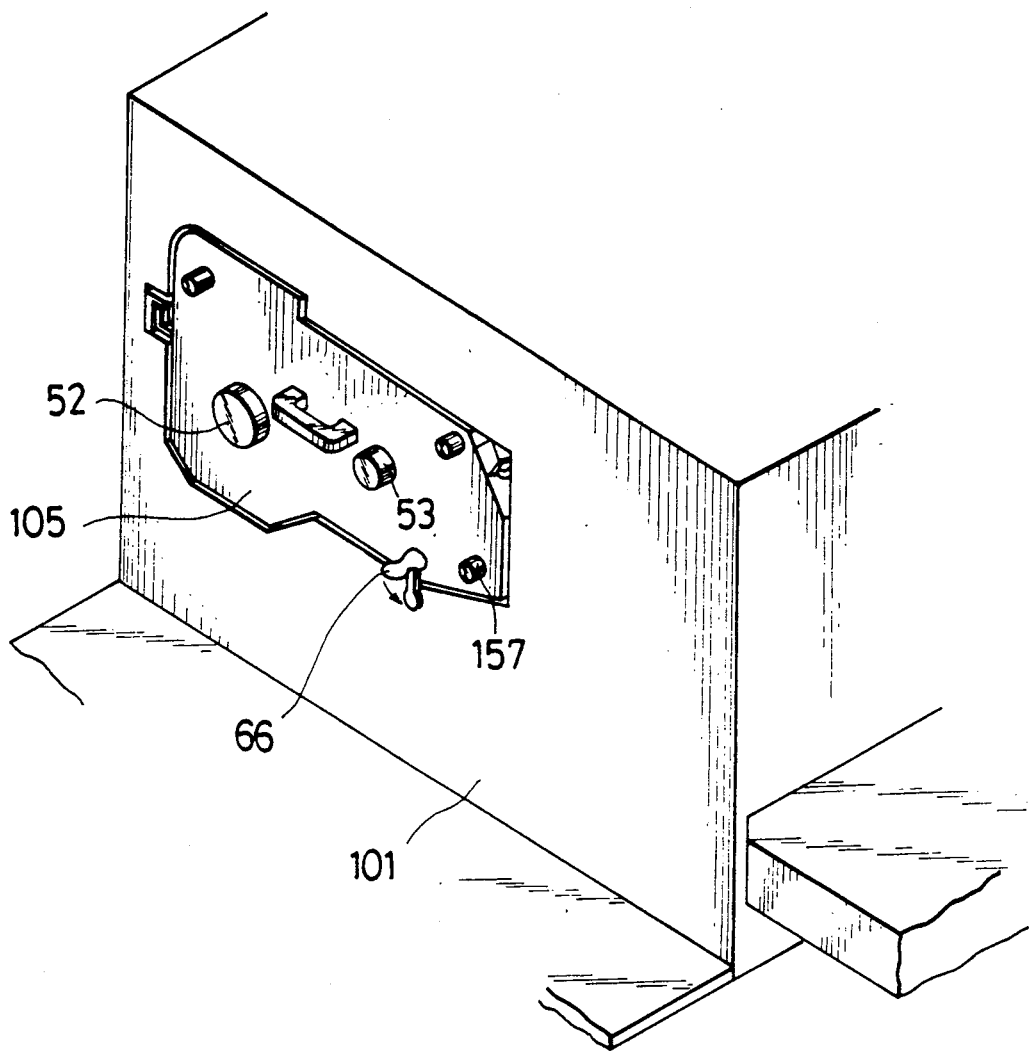
FIG. 7 is a perspective view showing the media cartridge in a mounted condition of the embodiment in FIG. 4.

FIG. 4 shows a copying apparatus of a second embodiment according to the present invention. FIGS. 5 to 7 show the media cartridge in the second embodiment. In FIGS. 4 to 7, the same elements as those in FIGS. 1 to 3 carry the same reference numerals and the explanations thereof are omitted.

In FIG. 4, a lower pressure roller 106 is provided in a main body 101 of the copying apparatus. A media cartridge 105 is detachably mounted in the main body 101.

In FIG. 5, an upper pressure roller 157 is provided in the media cartridge 105. The sheet 54 is transported through the upper pressure roller 157 and is wound up by the winding-up shaft 53.

As shown in FIG. 4, the lower pressure roller 106 and the upper pressure roller 157 make a pair of pressure rollers for pinching the sheet 54 and the receiver sheet therebetween for the pressure developing process.

When the media cartridge 105 is mounted in the main body 101, the lower pressure roller 106 is loaded upwardly such that the lower pressure roller 106 and the upper pressure roller 157 abut to and press each other. When the media cartridge 105 is to be drawn out from the main body 101, the pressure force applied to the lower pressure roller 106 is released such that it is easily performed to draw out the media cartridge 105 along the rails 11a, 11b as shown in FIG. 6. FIG. 7 shows the media cartridge 105 mounted in the main body 101. The abutting position of the lower pressure roller 106 and the upper pressure roller 157 is a position for pressure developing of the sheet 54.

The mechanism for applying and releasing the pressure force to the lower pressure roller 106 will be explained below with reference to FIG. 8.

Figure 8:
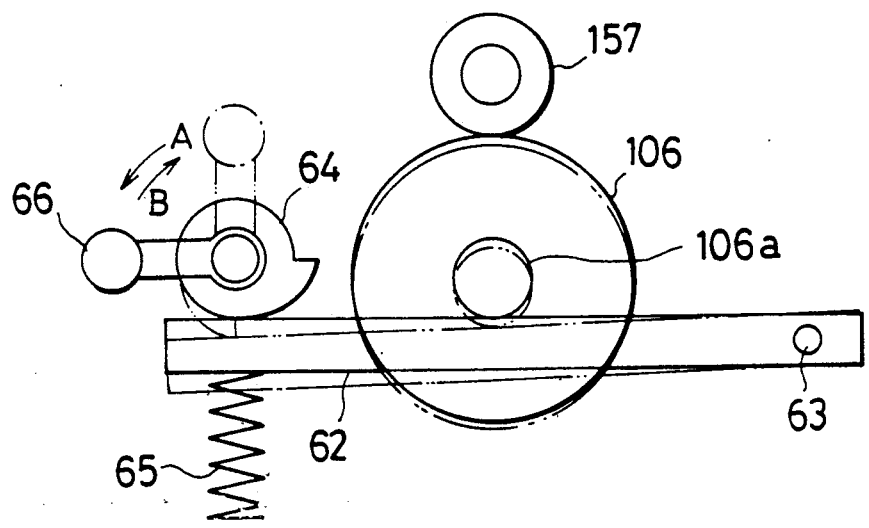
FIG. 8 is a schematic front elevational view explaining the pressure force applying and releasing mechanism of the embodiment in FIG. 4.

In FIG. 8, t he lower pressure roller 106 is provided with a shaft 106a and is supported by an arm 62 from the under side thereof at the shaft 106a. The arm 62 is provided with a supporting shaft 63 at one end thereof and is supported to the main body 101 rotatably around the supporting shaft 63. The other end of the arm 62 is loaded upwardly by a spring member 65 disposed under the arm 62. On the upper side of the other end of the arm 62, a cam 64 is disposed. The cam 64 is rotatable around its rotation axis by about 90 degrees by use of a lever 66.

When the cam 64 is rotated in a direction indicated by an arrow A, the cam radius becomes smaller as shown by a solid line in FIG. 8 so that the cam 64 does not press the arm 62 while the spring member 65 raises the arm 62 and the lower pressure roller 106 upwardly.

On the contrary, when the cam 64 is rotated in a direction indicated by an arrow B, the cam radius becomes larger as shown by a two dotted chain line in FIG. 8 so that the cam 64 presses downwardly the arm 62 against the spring force of the spring member 65. Then, the lower pressure roller 106 is lowered such that the pressure force applied to the lower pressure roller 106 is released.

As described above, the lower pressure roller 106 and the upper pressure roller 157 are able to apply and release the pressure force.

As described before, when the media cartridge 105 is mounted in the main body 101, the pressure force is applied. When exchanging the media cartridge 105, the pressure force is released. In order to release the pressure force, the lever 66 is positioned upper side by rotating it in the B direction, and thus, it can not be performed to draw out the media cartridge 105 because the lever 66 hampers the way of the media cartridge 105 as shown in FIG. 8. However, when the pressure force is released, the lever GG is turned to be horizontal and retreats itself from the front face of the media cartridge 105, enabling the media cartridge 105 to be drain out. That is to say, in the copying apparatus of the second embodiment, only when the pressure force of the lower pressure roller 106 and the upper pressure roller 157 is released, the exchanging operation of the media cartridge 105 can be performed. By the existence of the lever 66, the user can easily notice whether it is in the pressure applied condition or the pressure released condition, resulting in preventing the user from breaking the copying apparatus by forcibly drawing out the media cartridge 105 in the pressure applied condition.

An operation of thus constructed second embodiment is explained below with reference to FIG. 4.

Before the copying operation is started, the media cartridge 105 is inserted to the main body 101 and the pressure force is applied at the lower pressure roller 106 and the upper pressure roller 157 by rotating the lever 66. Thus, the sheet 64 can be transported in accordance with the rotation of the lower pressure roller 106 and the upper pressure roller 157.

Then, the original to be copied is placed on the original table 2 and the copying operation starts, and the operation same as in the case of the first embodiment will follow.

As described above, according to the copying apparatus of the second embodiment, the sheet 54 is transported only within the media cartridge 105 from the supplying shaft 52 to the winding-up shaft 53. Thus, the media cartridge 105 can be very easily exchanged in the second embodiment. Namely, it is only required to release the pressure force and draw out the media cartridge 105 and then to insert another cartridge and apply the pressure force for the media cartridge exchanging operation.

In the second embodiment, the application and release of the pressure force is performed manually by the lever 66. This, however, can be performed by use of a motor or a solenoid for an automatic operation.

Many widely different embodiments of the present invention may be constructed without departing from the spirit and scope of the present invention. It should be understood that the present invention is not limited to the specific embodiments described in this specification, except as defined in the appended claims.

What is claimed is:

1. An image forming apparatus comprising;
a main body;
an optical means provided in said main body for producing an exposure light of an image signal; and
a media cartridge detachably mounted to said main body, including a supplying shaft on which unused photosensitive and pressure sensitive sheet is rolled for continuously supplying said unused sheet, an exposure section where said supplied unused sheet is exposed by said exposure light for forming a latent image on said supplied unused sheet, a pressure developing section to which an image receiver sheet is supplied and at which said receiver sheet is superposed and pressed onto said exposed sheet for pressure-developing an image onto said receiver sheet from said latent image, and a winding up shaft for winding up said used sensitive sheet.

2. An image forming apparatus according to claim 1, wherein said sensitive sheet comprises a sheet coated with microcapsules including photohardening material and coloring material in each shell.

3. An image forming apparatus according to claim 1, wherein said receiver sheet comprises a sheet coated with developing material.

4. An image forming apparatus according to claim 1, wherein said media cartridge further includes an accommodation room, in which said unused sheet rolled on said supplying shaft is accommodated, for shielding said unused sheet from external light and stray light.

5. An image forming apparatus according to claim 4, wherein said accommodation room is provided with an opening, from which said unused sheet is supplied, and a light shielding member disposed at said opening so as to prevent external light from entering said accommodation room through said opening.

6. An image forming apparatus according to claim 1, further comprising a heating device disposed in said main body for heating said pressed receiver sheet.

7. An image forming apparatus according to claim 1, further comprising a pair of first rails disposed in said main body and a pair of second rails disposed on said media cartridge, said first and second rails being engaged with each other so as to make said media cartridge slidable along said first and second rails with respect to said main body.

8. An image forming apparatus according to claim 1, further comprising a light shielding guide disposed in said main body for covering and shielding said supplied unused sheet and said exposed sheet from stray light.

9. An image forming apparatus according to claim 1, wherein said image forming apparatus comprises a copying apparatus.

10. An image forming apparatus according to claim 9, wherein said optical means comprises a light source for illuminating an original and an optical body for transmitting a reflected light from said original to said exposure section.

11. An image forming apparatus according to claim 1, wherein said developing section includes a pair of pressure rollers for pressing said receiver sheet onto said exposed sheet therebetween.

12. An image forming apparatus according to claim 1, wherein said developing section includes a first roller, said image forming apparatus further comprising a second roller which is disposed in said main body and is movable to one position, where said second roller abuts to said first roller so as to press said receiver sheet onto said exposed sheet therebetween, and to another position, where said second roller is apart from said first roller.

13. An image forming apparatus according to claim 12, wherein said second roller is moved by a lever.

14. An image forming apparatus according to claim 12, wherein said second roller abuts to said first roller by a spring force.

15. A media cartridge for use in an image forming apparatus which forms an image on an image receiver sheet by exposing and pressure-developing a photosensitive and pressure sensitive sheet and to which said media cartridge is detachably mounted, comprising:

a supplying shaft on which unused photosensitive and pressure sensitive sheet is rolled for continuously supplying said unused sheet;

an exposure section, where said supplied unused sheet is exposed by an exposure light of image signal produced in said image forming apparatus, for forming a latent image on said supplied unused sheet;

a pressure developing section, to which said receiver sheet is supplied and at which said receiver sheet is superposed and pressed onto said exposed sheet, for pressure-developing an image onto said receiver sheet from said latent image; and a winding-up shaft for winding up said used sensitive sheet.

* * * * *